(12) United States Patent
Lin

(10) Patent No.: US 6,969,234 B2
(45) Date of Patent: Nov. 29, 2005

(54) FAN GUIDE HOOD STRUCTURE

(75) Inventor: Fang-Cheng Lin, Jhonghe (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 39 days.

(21) Appl. No.: 10/747,483

(22) Filed: Dec. 25, 2003

(65) Prior Publication Data
US 2005/0100443 A1    May 12, 2005

(30) Foreign Application Priority Data
Nov. 7, 2003   (TW) .............................. 92219841 U

(51) Int. Cl.[7] ............................................ F03D 11/00
(52) U.S. Cl. .................. 415/214.1; 415/227; 361/695; 361/697
(58) Field of Search .......................... 415/214.1, 213.4, 415/177, 227, 220, 213.1; 361/695, 696, 361/697

(56) References Cited

U.S. PATENT DOCUMENTS

| | | | | |
|---|---|---|---|---|
| 4,517,880 A | * | 5/1985 | Buckner et al. ............. | 454/184 |
| 6,736,196 B2 | * | 5/2004 | Lai et al. ..................... | 165/122 |
| 6,791,837 B2 | * | 9/2004 | Chen et al. .................. | 361/695 |

* cited by examiner

Primary Examiner—Edward K. Look
Assistant Examiner—Dwayne J. White

(57) ABSTRACT

A fan guide hood structure includes a fixing seat and a hood. The fixing seat has a hollow cylinder, which has clamping parts and guide rails arranged in symmetry at its edge and a fixing part on its top. The fixing part is designed to couple with the fan unit and the hood has a sleeve at one end. The sleeve has clamping grooves and slide grooves corresponding to said clamping parts and said guide rails and extends downwards to form a trumpet hood part. An elastic member lies between said hood part and said fixing seat and the whole structure forms a seamlessly adjustable guide hood structure.

7 Claims, 3 Drawing Sheets

FAN GUIDE HOOD STRUCTURE

BACKGROUND OF THE INVENTION

1. Field of the Invention

The present invention relates to a fan guide hood structure, in particular to a seamlessly adjustable fan guide hood structure.

2. Brief Description of Related Art

As CPU evolves fast, heat radiation performance of CPU becomes more and more important because CPU overheat will significantly degrade operation efficiency. Usually the heat generated from CPU is radiated with a heat radiation device mounted on surface of CPU. Such a heat radiation device comprises a fan unit and a radiator coupled with each other; heat from CPU is led off by the radiator and then expelled by the fan, thus the CPU is cooled.

However, traditional heat radiation method is inefficient because the power of fan diffuses as expelling distance increases. To overcome the disadvantage, a fan hood structure in upturned bell mouth form is introduced. The smaller end of the fan hood is coupled with the said fan unit; the bigger end of the fan hood is coupled with the said radiator; in this way, the airflow is guided completely to the said radiator to achieve better heat radiation performance.

Though such a fan hood structure improves heat radiation performance, it is unable to adapt to specific assembly of the casing, CPU and heat radiation device due to its fixed form; often, such a fan hood can't be mounted in a specific casing containing specific CPU and heat radiation device, resulting in inconvenience to users.

SUMMARY OF THE INVENTION

A main object of the present invention is to provide a seamlessly adjustable fan guide hood structure that employs a fixing seat, a hood, and an elastic element.

To attain said object, the fan guide hood structure according to the present invention comprises a fixing seat and a hood, said fixing seat has a hollow cylinder, which has clamping parts and guide rails arranged in symmetry at its edge and a fixing plate on its top; said fixing plate has a fixing hole and a pole; said hood has a sleeve, and said sleeve has clamping grooves and slide grooves; said sleeve extends downwards to form a bell mouth-shape hood part, which also has a pole; when said fixing seat is placed into said sleeve, said clamping parts and guide rails can couple with said clamping grooves and slide grooves respectively, and said elastic element is fitted onto said two poles to provide elastic restoring force; in this way, a fan guide hood is formed.

DETAILED DESCRIPTION OF THE PREFERRED EMBODIMENT

Figure 1:
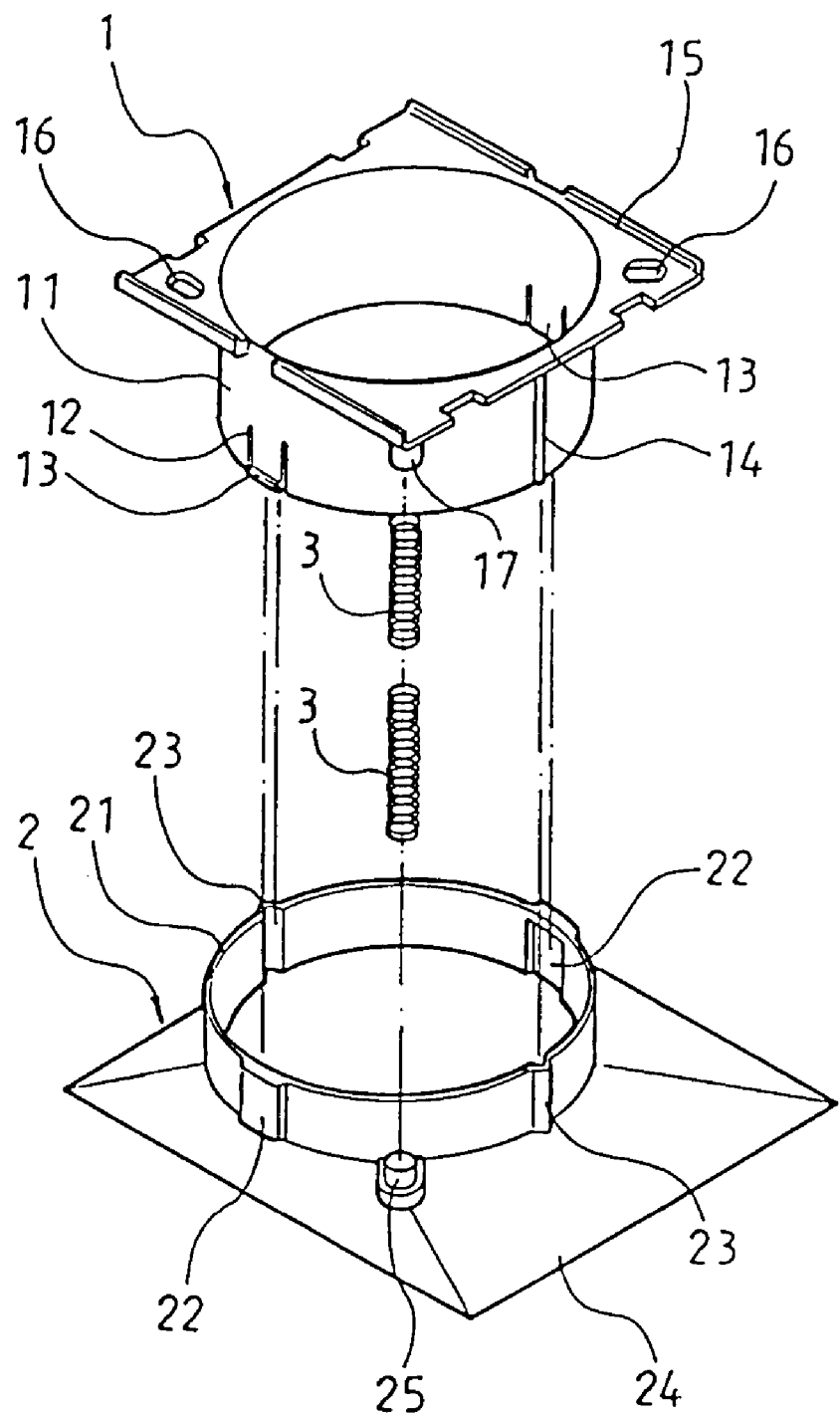
FIG. 1 is a 3D exploded view of the present invention.
Figure 2:
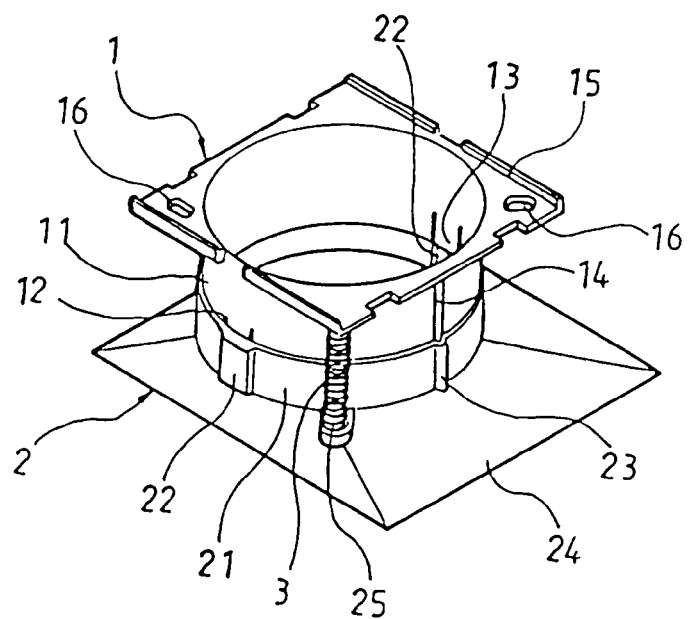
FIG. 2 is a 3D view of the present invention.
Figure 3:
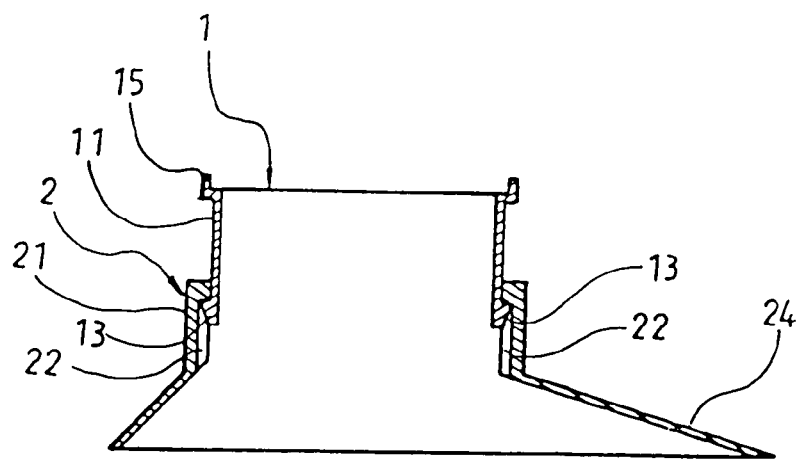
FIG. 3 is a sectional view of the present invention.
Figure 4:
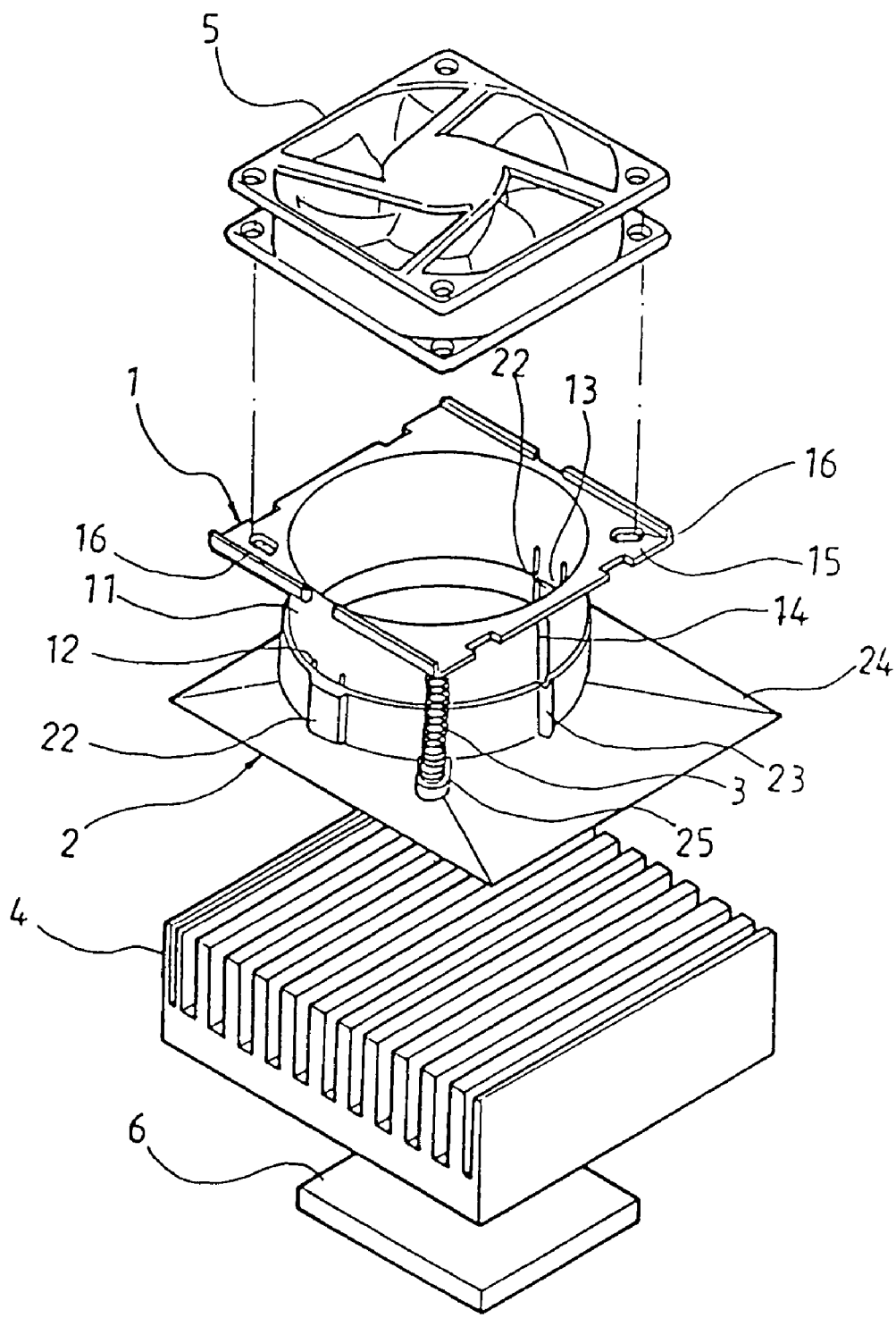
FIG. 4 shows an embodiment of the present invention.

Referring to FIGS. 1 and 2, the present invention main comprises a fixing seat 1 and a hood 2; wherein said fixing seat 1 has a hollow cylinder 11, which has elastic clamping parts 13 (formed by cutting hole 12) and slide rails 14 (the clamping parts 13 and slide rails 14 are arranged in symmetry (90°) in the embodiment); said cylinder 11 has a fixing plate 15 on its top, which has a fixing hole 16 at its upper edge to couple with the fan as well as a pole 17 at its lower edge; said hood 2 has a sleeve 21, which is slightly bigger that the hollow cylinder 11 of the fixing seat 1; said sleeve 21 has, on its inner surface, clamping grooves 22 corresponding to the clamping parts 13 of said fixing seat 1 as well as slide grooves 23 corresponding to said slide rails 14; said sleeve 21 extends downwards from said cylinder 11 to form a bell mouth hood part 24, which has a pole 25 corresponding to the pole 17 on said fixing plate. When above components are assembled, the cylinder 11 of said fixing seat 1 is fitted onto sleeve 21 of said hood 2, said clamping parts 13 clamp onto said clamping grooves 22, said slide rails 14 embed into said slide grooves 23; in that way, said fixing seat 1 may slide up and down freely along said sleeve 21, but it can neither revolve in relative to said sleeve 21 due to the fixing effect resulted from coupling between slide rails 14 and slide grooves 23 nor fall off from said sleeve 21 due to the clamping effect resulted from coupling between clamping part 13 and clamping groove 22. In that way, a guide hood is formed. In actual application, the fan is mounted onto fixing hole on the fixing plate 15 of said fixing seat 1, the hood part 24 is covered onto the radiator to concentrate the power of the fan completely onto fins of the radiator to improve heat radiation performance significantly. In addition, the height of fixing seat 1 may be adjusted with the elastic member 3 to adapt to different types of casings.

In addition, the elastic member 3 in the invention may be directly fitted onto sleeve 21 of hood 2. Thus it will be pressed under the clamping action of said fixing plate 15 and hood part 24 to implement a structure that is more reliable and smoothly adjustable to adapt to different casings.

Furthermore, at least a locating groove (not shown in the drawings) may be designed in the clamping groove of the sleeve to enable adjusting the fixing seat and the hood section by section.

In conclusion, the present invention provides an adjustable fan guide hood structure, which is used to be fixed onto the fan and the radiator.

What is claimed is:

1. A fan guide hood structure, comprising:
   a fixing seat, which has a hollow cylinder, said cylinder having clamping parts at its lower edge and a fixing plate at its upper edge, and said fixing plate having a pole at its lower side;
   a hood, which has a sleeve with an inner diameter slightly bigger than the cylinder of said fixing seat, said sleeve having clamping grooves corresponding to the clamping parts of said fixing seat at its inner wall surface, a bell mouth hood part extruding downwards and another pole being disposed on the bell mouth hood part corresponding to the pole of said fixing plate; and
   an elastic element with two ends, being disposed between the pole on said fixing plate and the pole on said hood part with the ends linking the poles respectively;
   whereby, the fan guide hood structure is formed once the preceding components are assembled with said fixing seat being placed into said hood and said clamping parts clamping into said clamping grooves.

2. A fan guide hood structure according to claim 1, wherein each of the clamping parts is an elastic plate formed by way of cutting a hole.

3. A fan guide hood structure according to claim 1, wherein said cylinder has slide rails at its outer edge, and said sleeve has slide grooves on its inner wall surface corresponding to the slide rails.

4. A fan guide hood structure according to claim 1, wherein said elastic element is pressed under the clamping action of said fixing plate and said hood part to form a more reliable and smoothly adjustable structure.

5. A fan guide hood structure, comprising:
  a fixing seat, which has a hollow cylinder, said cylinder having clamping parts at its lower edge and a fixing plate at its upper edge to couple with a fan; and
  a hood, which has a sleeve with an inner diameter slightly bigger than the cylinder of said fixing seat, said sleeve having clamping grooves corresponding to the clamping parts of said fixing seat at its inner wall surface and a bell mouth hood part extruding downwards from the sleeve for covering a radiator.

6. A fan guide hood structure according to claim 1, wherein the clamping grooves have at least a locating groove inside respectively.

7. A fan guide hood structure according to claim 5, wherein the clamping grooves have at least a locating groove inside respectively.

* * * * *